United States Patent
Bertin et al.

(10) Patent No.: US 6,570,806 B2
(45) Date of Patent: May 27, 2003

(54) SYSTEM AND METHOD FOR IMPROVING DRAM SINGLE CELL FAIL FIXABILITY AND FLEXIBILITY REPAIR AT MODULE LEVEL AND UNIVERSAL LASER FUSE/ANTI-FUSE LATCH THEREFOR

(75) Inventors: Claude Louis Bertin, South Burlington, VT (US); John Atkinson Fifield, Underhill, VT (US); Nicholas Martin Van Heel, Eagle, ID (US); Jason Timothy Varricchione, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/891,025

(22) Filed: Jun. 25, 2001

(65) Prior Publication Data

US 2002/0196693 A1 Dec. 26, 2002

(51) Int. Cl.[7] .............................................. G11C 7/00
(52) U.S. Cl. ..................... 365/225.7; 365/200; 327/525
(58) Field of Search .............................. 365/225.7, 200; 327/525

(56) References Cited

U.S. PATENT DOCUMENTS

| | | | |
|---|---|---|---|
| 5,345,110 A | 9/1994 | Renfro et al. | 307/272.3 |
| 5,956,282 A | 9/1999 | Casper | 365/225.7 |
| 6,426,668 B1 * | 7/2002 | Morrish et al. | 327/525 |

* cited by examiner

Primary Examiner—Huan Hoang
(74) Attorney, Agent, or Firm—Scully, Scott, Murphy & Presser; H. Daniel Schnurmann

(57) ABSTRACT

A universal fuse latch device includes a latch circuit receiving an electrical signal for initializing the latch circuit to a first state; one or more legs connected at the latch node, with a first leg implementing a fuse type element capable of transitioning the latch from the first state to a second state; and a second leg including an anti-fuse type element, wherein the fuse latch is provided with a fuse resistance trip point to ensure adequate reading of one of the fuse and anti-fuse type elements. The universal fuse latch device may be part of a programmable fuse bank including a plurality of information fuse latches for storing redundancy information in a memory system and capable of being simultaneously interrogated. A master fuse control device comprising the universal fuse latch circuit is programmed in accordance with a priority of legs to be interrogated in the information fuse latches.

23 Claims, 6 Drawing Sheets

SYSTEM AND METHOD FOR IMPROVING DRAM SINGLE CELL FAIL FIXABILITY AND FLEXIBILITY REPAIR AT MODULE LEVEL AND UNIVERSAL LASER FUSE/ANTI-FUSE LATCH THEREFOR

BACKGROUND OF THE INVENTION

1. Field of the Invention

This invention relates generally to universal fuse latch circuits and, more particularly, to a new universal laser fuse/anti-fuse latch circuit and redundancy applications therefor.

2. Discussion of the Prior Art

FIG. 1 illustrates a prior art fuse latch circuit 10 comprising a fuse element 12 shown connected to strobe device (transistor) T7, and to a latch circuit formed by transistors T1, T2, T3 and inverter device 14. A latch precharge device (transistor) T6 is also shown connected to a power supply and a terminal of T7. In this circuit 10, a metal or other conductive material fuse element 12 is used to indicate one of two logical states. For example, if left intact, the latch will indicate a first logical state, or if programmed by laser oblation it may indicate a second logical state. The latch circuit 10 is typically used to equate these two opposite conductive states to opposite logical states. That is, the latch circuit 10 converts the fuse's resistive levels into an electrical voltage level indicative of a logical 1 or 0.

A typical fuse read operation performed by the latch circuit 10 of FIG. 1 is implemented as follows: First, the precharge transistor device T6 is pulsed by signal 31 to precharge the latch 10 to a first logical state. Subsequently, the strobe device T7 is pulsed on by signal 22. If the fuse element is intact, it is conductive and drains off the precharge voltage from the latch node and forces it to a second logical state. Discharge of the latch's preconditioning is made easier by disconnecting the cross-coupling when the strobe device is active which is accomplished by series device T2. If the fuse element 12 has been programmed, it no longer conducts enough to drain sufficient charge off the latch node to change the logical state of the latch. In this case, when the strobe device is activated, the latch remains in its first logical state.

It is often desirable for the fuse latch device 10 to be able to store a logical state indicative of the logical state of the fuse so that when the latch is then connected to other circuits, it may provide programming information for other electronic circuits such as address relocation for redundant memory elements, operating mode configuration, and to store a tracking code pertaining to manufacture date or other conditions, for example. U.S. Pat. No. 5,345,110 to Renfro (Micron Inc.) describes a similar fuse latch device. Additionally, U.S. Pat. No. 5,956,282 Casper (Micron Inc.) describes a prior art anti-fuse latch that is large, cumbersome and has no means to multiplex between traditional laser fuses, electrically oblated fuses and anti-fuse elements.

As the semiconductor industry replaces the traditional laser fuse technology with more flexible and denser electrically programmable "eFUSE" elements, there is a need for a fuse latch capable of operating with both the old and new technology.

Traditional laser fuses have an unprogrammed resistance of less than 10 ohms, and a programmed resistance of greater than 100,000 ohm. Hence, a fuse latch which is designed with a resistive trip point of 10,000 ohms will function properly with adequate manufacturing margin of 10X. An unprogrammed electrical fuse may have a resistance of 100 ohms, which may increase to 100,000-ohms or higher when successfully programmed. If an electrical fuse which, when programmed, has less than 3-orders of magnitude resistance change, it may present a reliability problem and may need to be re-programmed or screened out. It is, therefore, desirable to have different latch trip resistances for different fuse, or anti-fuse types.

Further, as technology develops, evaluation of various electronic fuse types must be made while preserving the existing, and proven laser fuse circuitry. The evaluation of novel fuse structures, along side existing and proven fuse technology, has increased chip size. A fuse latch which can function with various fuse types, e.g., 1) existing laser fuses, 2) normally open-circuit "anti-fuses", and 3) normally short-circuit conductive-link fuses, is highly desirable.

While separate fuse latches may be designed with different latch feedback strengths to achieve various resistance trip points, latch area efficiently becomes significantly decreased. Alternately, a latch with an intermediate trip point may be designed as a compromise, but will likely cause yield loss as the latch is not optimized for either fuse type. Thus, it would be further desirable to provide a single universal fuse latch circuit design that provides flexibility to program and utilize various fuse types and, minimize the die size.

It would be further highly desirable to provide a control device for a universal fuse latch circuit that is flexible and enables simple and automatic selection of the type of fuse to use in the universal fuse latch circuit.

SUMMARY OF THE INVENTION

It is an object of this invention to provide a universal fuse latch circuit which is capable of sensing several types of fuse and anti-fuse elements.

It is another object of this invention to connect several legs or conductive paths to the universal fuse latch circuit to provide varying amounts of fuse resistance that may be required to trip the state of the fuse latch.

It is a further object of this invention to provide a fuse latch which has separate fuse resistance trip points for different fuse technologies to insure adequate programming of each fuse type.

It is yet another object of the present invention to provide a control device for a universal fuse latch circuit that is flexible and enables simple and automatic selection of the type of fuse to use in the universal fuse latch circuit.

It is still another object of this invention to provide a means to use a laser programmed fuse type by logical selection, and a second electrical fuse or anti-fuse element by a second logical selection.

It is yet a further object of this invention to provide a programmable fuse bank that implements information fuse latches each comprising a universal fuse latch circuit that may store information in one of legs comprising fuse type elements or legs comprising anti-fuse type elements, and a flexible mechanism for interrogating the information fuse latches.

Thus, according to the principles of the invention, there is provided a universal fuse latch device comprising a latch circuit receiving a precharge signal and latching the precharge signal at a latch node thereof for initializing the latch to a first state; and one or more legs connected at the latch node, with a first leg implementing a fuse type element capable of transitioning the latch from the first state to a second state, and a second leg including an anti-fuse type element, wherein the fuse latch is provided with a fuse resistance trip point to ensure adequate programming of one of the fuse and anti-fuse type element.

In one application, the universal fuse latch device is implemented as part of a programmable fuse bank comprising a plurality of information fuse latches for storing redundancy information in a memory system and capable of being simultaneously interrogated. A master fuse control device comprising the universal fuse latch circuit is provided that is programmed in accordance with a priority of legs to be interrogated in the information fuse latches. The system and method of the invention implements logic circuits and devices for determining the priority of legs that are to be interrogated for accessing the redundancy information and for generating appropriate interrogation strobe and leg selection signals to enable proper interrogation of the information fuse latches according to the determined priority while preventing simultaneous interrogation of each first leg and second leg of each of the plurality of programmed information fuse latches.

Advantageously, the provision of a universal fuse latch circuit capable of sensing several types of fuse and anti-fuse elements minimizes die size. Furthermore, the system and method of the invention is particularly applicable for improving dynamic random access memory (DRAM) and embedded DRAM (eDRAM) single cell fixability and flexibility repair at the module level.

BRIEF DESCRIPTION OF THE DRAWINGS

Further features, aspects and advantages of the apparatus and methods of the present invention will become better understood with regard to the following description, appended claims, and the accompanying drawings where:

DESCRIPTION OF THE PREFERRED EMBODIMENTS

Figure 2:
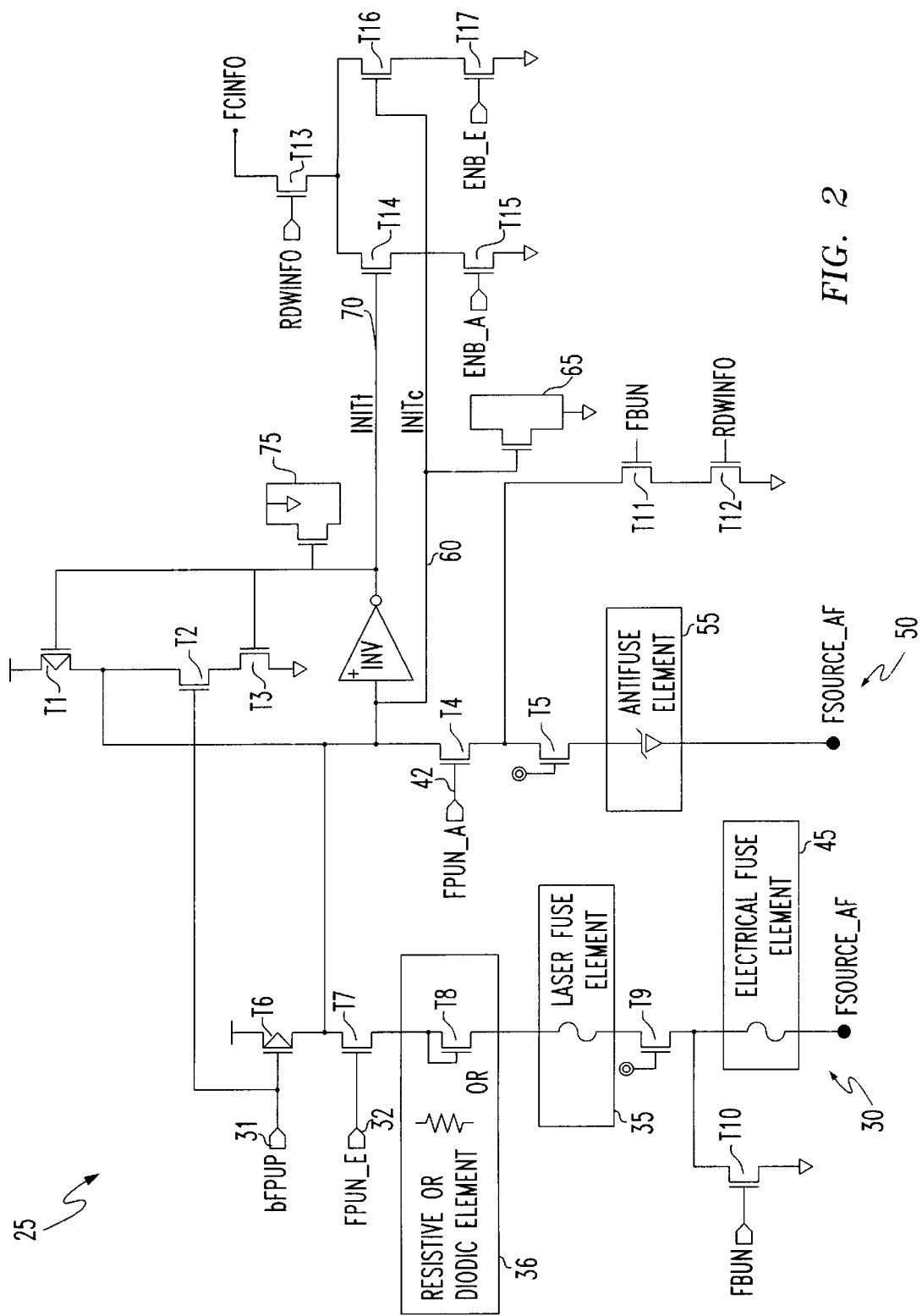
FIG. 2 illustrates a circuit schematic depicting the universal latch device 25 adapted to provide different latch trip resistances for different fuse, or anti-fuse latch circuit types according to the principles of the invention.

FIG. 2 illustrates a circuit schematic depicting the universal latch device 25 that is adapted to provide different latch trip resistances for different fuse, or anti-fuse latch circuit types.

In the universal latch circuit 25 shown in FIG. 2, the fuse latch circuit 10 of the prior art has been modified to include a first fuse polling leg, or strobing path 30 through transistors T7, T8, and T9 and which includes a traditional laser fuse element 35 and an electrical fuse element 45. Activation of the laser fuse element, or the electrical fuse is done by activation of T7 by pulsing the FPUN_E strobe signal 22. The laser and the electrical fuses 35, 45 are normally conductive in their unprogrammed state, so if either of them has been programmed, the latch 25 will correctly sense an "open" circuit. Additionally provided in the universal latch circuit 25 of FIG. 2 is the capability of performing a second polling through a strobing leg or path 50 using transistors T4 and T5 and an anti-fuse element 55. The state of the anti-fuse element 55, which is non-conductive in its unprogrammed state, is determined by activation of the second polling or strobing device T4 via a signal FPUN_A 42.

As will be described in greater detail, the universal fuse latch circuit 25 of the invention is designed to differentiate between a high "1" state and a low "0" state as a function of the fuse resistance. The anti-fuse device 55 above, typically formed by two conducting materials separated by an insulating material, will form a conducting filament when programmed, and may have a conduction of 100 Kohms or less after programming. The electrical or "e-poly" fusible link 45, is formed by a conducting link of polysilicon which may have an unprogrammed resistance of around 200 ohms, and may have 10 Kohms or higher resistance after programming. The resistance of the laser fuse element 35 may be 10 ohms before and 10 Mohms after programming.

As mentioned, the universal latch circuit 25 is designed to flip logical states from its preconditioned state, i.e., discriminate between a '1' and '0', when a conductive element of less than a specific resistance is attached to its latch node INTc 60. The resistance required to flip the latch state is known as its resistive trip point. The universal latch circuit 25 may be designed to have a resistive trip point of, for example, 100 Kohms, which is herein referred to as the intrinsic latch trip resistance. As further shown in FIG. 2, the first leg 30 has an additional resistive, or diodic element 36 which may comprise a diode connected FET (T8), in series, that functions to alter the effective latch trip point when this leg is used. The simplest case involves use of a resistor element of 60 Kohms, for example, which requires that the fuse elements 35, 45 must be less than 40 Kohms to register as a programmed fuse. The purpose of this diodic element 36 is to provide a voltage drop in the first leg so the fuse resistance required to trip the latch is reduced over the intrinsic latch trip resistance. Alternately, an FET device biased in its linear region will provide an acceptable resistive element. Thus, element 36 may comprise an FET having a DC gate voltage V large enough to bias the device in the linear region.

Figure 1:
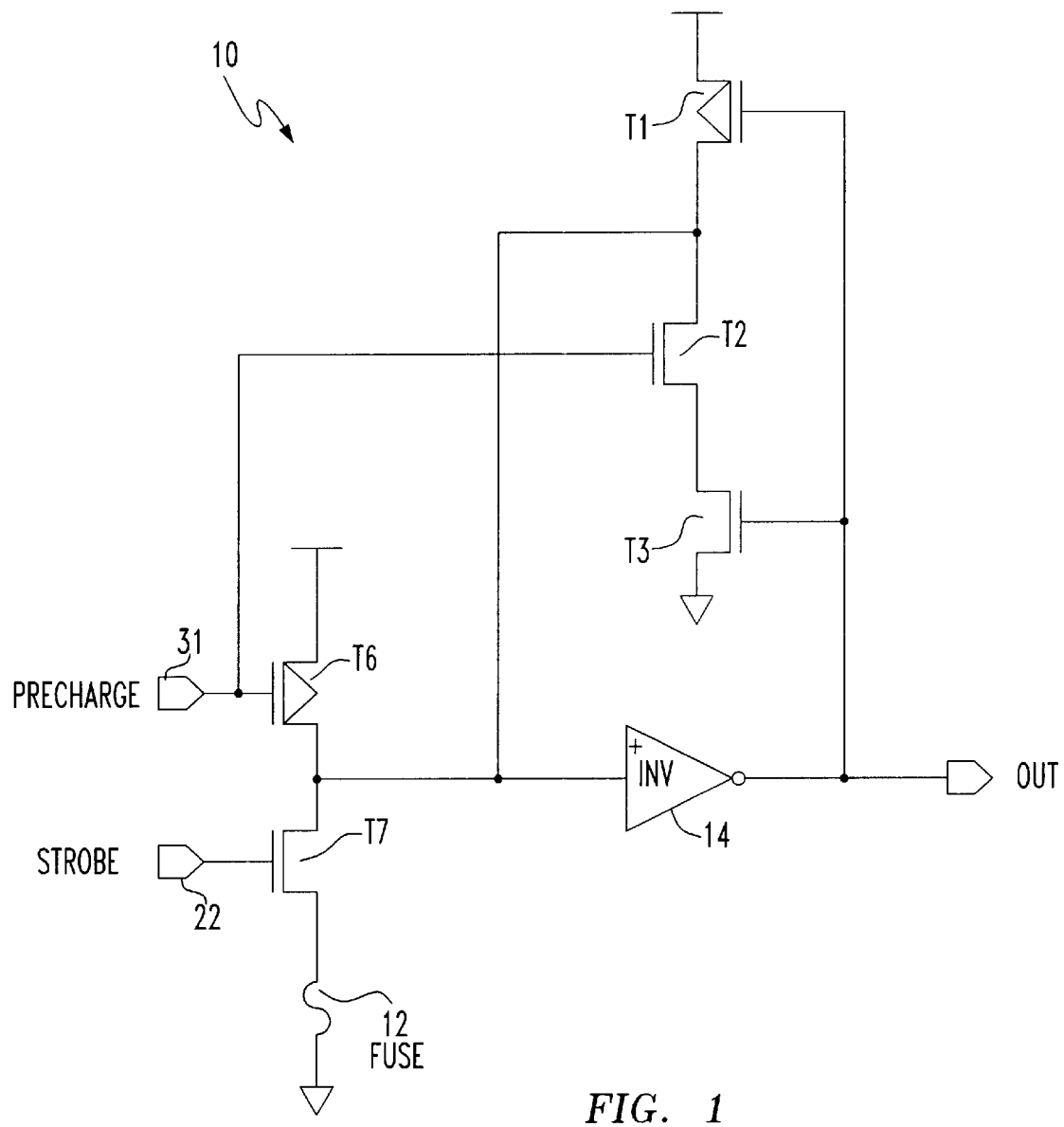
FIG. 1 is a general block diagram depicting a prior art fuse latch circuit 10.

As mentioned, in the circuit of FIG. 1, the latch trip point is designed to discriminate between a '1' and '0' at about 100 Kohms. As shown in FIG. 2, the first leg fuses 35, 45 are connected to the INTc latch node by a selection device T7 operable via selection signal FPUN_E and through the diodic element, e.g., an NFET diode T8, which provides current limiting and effectively decreases the resistance requirement of a fuse element, to set the fuse latch to a '0' state. The second leg anti-fuse element 55 has a direct connection between to the INTc node 60 through selection device T4 operable via selection signal FPUN_A.

Figure 3A:
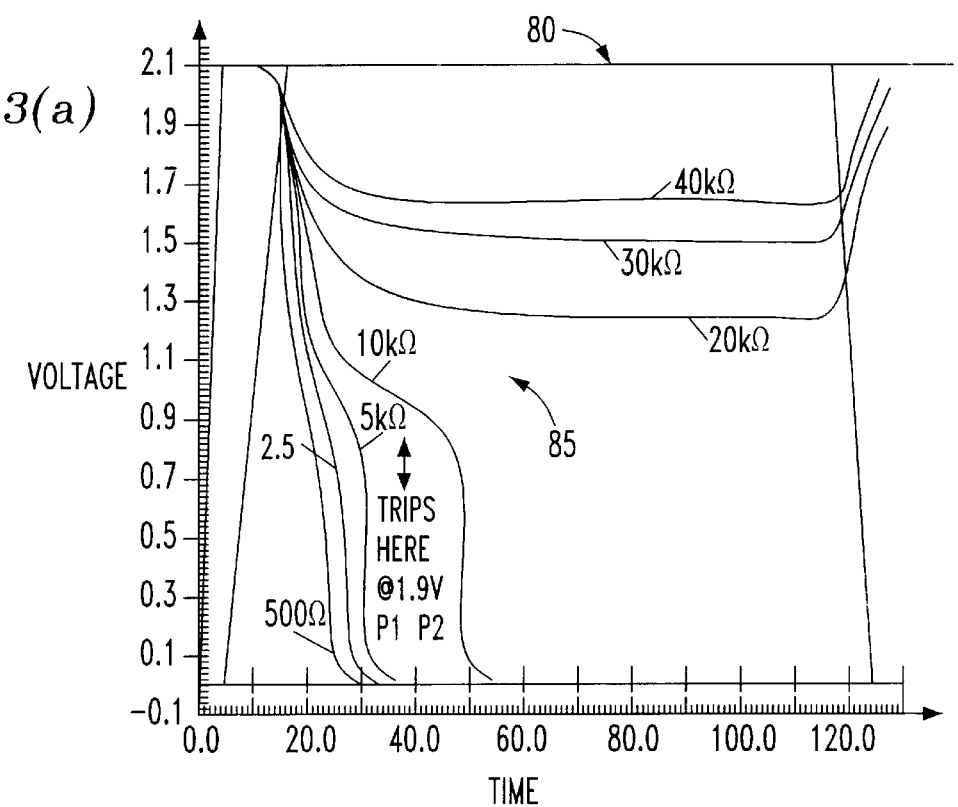
FIG. 3(a) illustrates the latch response 80 to various fuse resistance values in the first, or e-poly fuse leg 30 of the example universal fuse latch circuit 25 of FIG. 2.
Figure 3B:
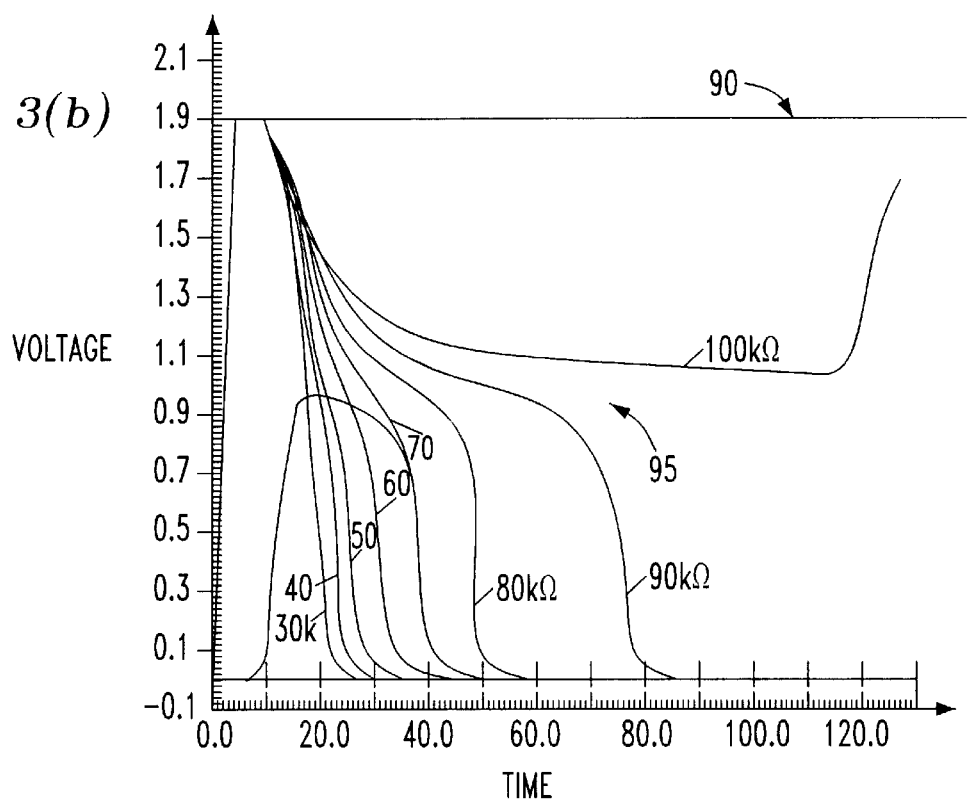
FIG. 3(b) illustrates the latch response 90 to various fuse resistance values in the second, or anti-fuse leg 40 of the example universal fuse latch circuit 25 of FIG. 2.

FIG. 3(*a*) illustrates the latch response 80 to various fuse resistance values ranging from 500 Ohms to 10 kOhms, and 20 kOhms to 40 kOhms, in the first, or e-poly fuse leg 30 of the example universal fuse latch circuit 25 of FIG. 2. As shown, the latch trip point 85 is about 10 Kohms over the PVT (Process Voltage and Temperature). That is, after applying a high voltage, e.g., 2.1 Volts at FPUN_E signal 32 at transistor device T7, the latch 25 will remain in its precharged state (e.g., '1'), i.e., no change in voltage at node initC 60, as long as the resistance at the e-poly fuse leg 30 has been programmed to be greater than 10 kOhms, for example, by blowing the e-poly fuse in the e-poly leg and including application of the diodic/resistive element 36. If the fuse in the e-poly fuse leg 30 is left intact (remains less than 10 kOhms in resistance), the latch will flip states.

FIG. 3(*b*) illustrates the latch response 90 to various fuse resistance values ranging from 30 kOhms to 100 kOhms in the second, or anti-fuse leg 50 of the example universal fuse latch circuit 25 of FIG. 2. As shown, the anti-fuse leg operates at opposite polarity than the e-poly fuse leg, which means that a blown fuse will short the anti-fuse leg to near ground. Thus, as shown in FIG. 3(*b*), the resistive trip point 95 for this circuit is about 100 Kohms over PVT. That is, in response to a high voltage at the FPUN_A, the latch will not change states (flip voltage at node initC) unless the resistance of the anti-fuse leg 50 drops below 100 kOhms, for example, by blowing the anti-fuse device in the anti-fuse leg.

With the intrinsic resistive trip point of the latch set to a relatively high value of 100 Kohms, for example, the universal fuse latch is vulnerable to upset by cosmic-rays or alpha particle generated hole-electron pairs. That is, the critical charge, "Qcrit," that may be applied to the nodes INITt 70 or INITc 60 (FIG. 2) by stray particles that may cause the latch to switch, is fairly low. To combat this problem of inherently low Qcrit, the universal fuse latch circuit 25 of FIG. 2 preferably includes a pair of ballast capacitors 65 and 75 connected to nodes INITc 60 and INITt 70, respectively. These ballast capacitors have been added to both sides of the latch to increase AC stability, without changing the DC trip point. As shown in FIG. 2, these ballast capacitors are preferably made from gate-oxide FET devices for best density and to prevent an increase in hole-electron collection area. An FET device type permitting the diffused nodes to be connected to the power supply rails should be chosen over an FET type with diffusions attached to the latch nodes.

Figure 4:
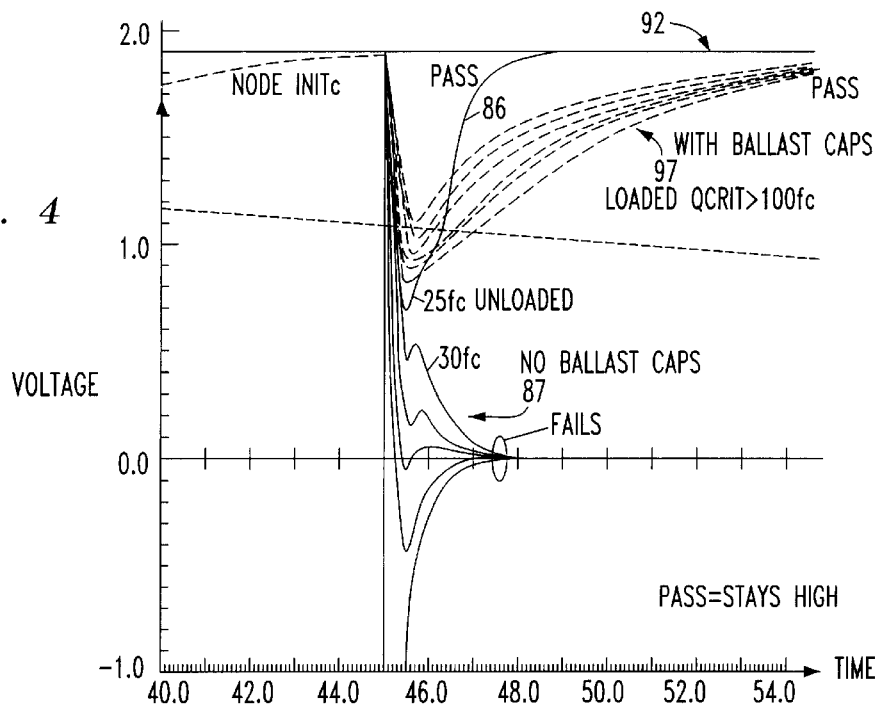
FIG. 4 illustrates the effect on Qcrit by adding ballast capacitors to both latch nodes of the universal fuse latch circuit 25.

FIG. 4 is a graph 92 illustrating the effect of the critical charge Qcrit applied to the example universal fuse latch circuit 25 of FIG. 2. Particularly, FIG. 4 illustrates the effect of added charge (e.g., a current pulse) to the universal fuse latch with solid lines 87 representing latch response (e.g., at latch node initC) to added charge without addition of ballast capacitors at latch nodes INITt and INITc, and broken lines 97 representing latch response to added charge with addition of ballast capacitors at latch nodes INITt and INITc. As shown in FIG. 4, the amount of charge added (Qcrit) increases from about 25 fc (ferntocoulombs) to over 100 fc with ballast capacitors having an area of about 10 um². For instance, as represented by line 86, a charge of 25 fc applied to the latch will not trip the latch at node initC whether ballast capacitors are provided or not. As represented by lines 87, application of a Qcrit charge ranging between 30 fc–100 fc will cause the latch to trip and fail without the addition of ballast capacitors. However, as represented by lines 97, application of a Qcrit charge ranging above 100 fc will not cause the latch to trip as long as ballast capacitors are present.

Figure 5A:
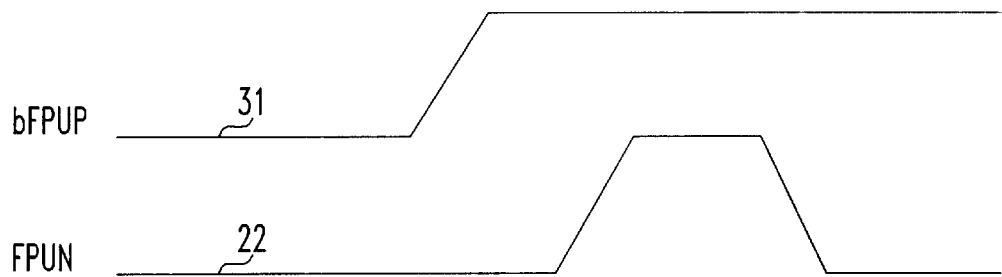
FIG. 5(a) depicts a timing diagram of the signals used for powering up and sensing the prior art fuse latch circuit 10.

As described herein with respect to the simplified fuse latch circuit 10 of FIG. 1, a well known procedure for powering up and sensing the prior art fuse latch circuit 100 essentially includes application of two signals as depicted in the timing diagram of FIG. 5(*a*): 1) a signal bFPUP 31 applied to the PRECHARGE input of the prior art fuse latch 100 for setting up its initial conditions; and, a pulse signal FPUN 22 that is applied to the STROBE input of the prior art fuse latch and will flip the latch if the fuse is intact or leave the latch in its previous state if the fuse is blown (open circuit). That is, in a normal redundancy fuse latch scheme there are two signals, a bFPUP 31 signal that initializes the latch to a known state and, a FPUN signal 22 that "interrogates" the laser fuse to see if it is blown or not.

As described herein with respect to FIG. 2, the universal redundancy fuse latch 25 of the invention has the ability to latch fuse data from either a laser/electric fuse or an anti-fuse path using two separate signals FPUN_E, FPUN_A, respectively. As the universal redundancy fuse latch 25 of FIG. 2 is implemented and realized into a large scale chip, there is a need to be able to control whether the latches should sense a laser fuse/e-fuse or an anti-fuse on a small scale. One solution is to have small domains where the fuse latch leg (e-fuse or anti-fuse) may be selected as needed. In a chip that has redundant elements, such as a DRAM, a selectable domain (a selectable domain being a group of fuses that must be of the same fuse type, e-fuse or anti-fuse, i.e., use the same fuse leg in the Universal Fuse Latch) could be one memory element which consists of "n" fuses (e.g. nine fuses), a master fuse latch (e.g., one fuse) which turns the element "on" and "n–1" (e.g., eight fuses) information fuses that may provide the address of the invoked redundancy element, for example.

The fuse latch sensing operation for the universal latch 100 of FIG. 2 however, becomes complicated as there are now two FPUN signals according to the invention: one FPUN_E signal 32 for "interrogating" the laser fuse leg 30 and the other FPUN_A signal 42 for "interrogating" the anti-fuse leg 50. It should be understood that only one of these FPUN signals 32, 42 may be active after bFPUP signal goes high, otherwise, an overwrite of the previously latched data may result.

Figure 6:
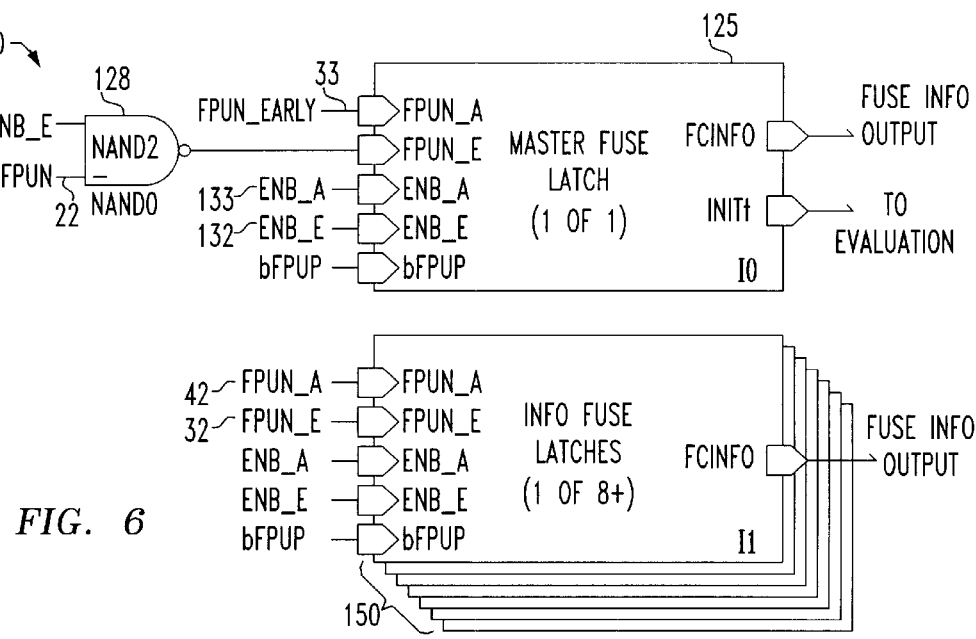
FIG. 6 is a circuit depiction of an example implementation of an individually controlled "fuse bank" 100 implementing universal fuse latches according to the invention.
Figure 7:
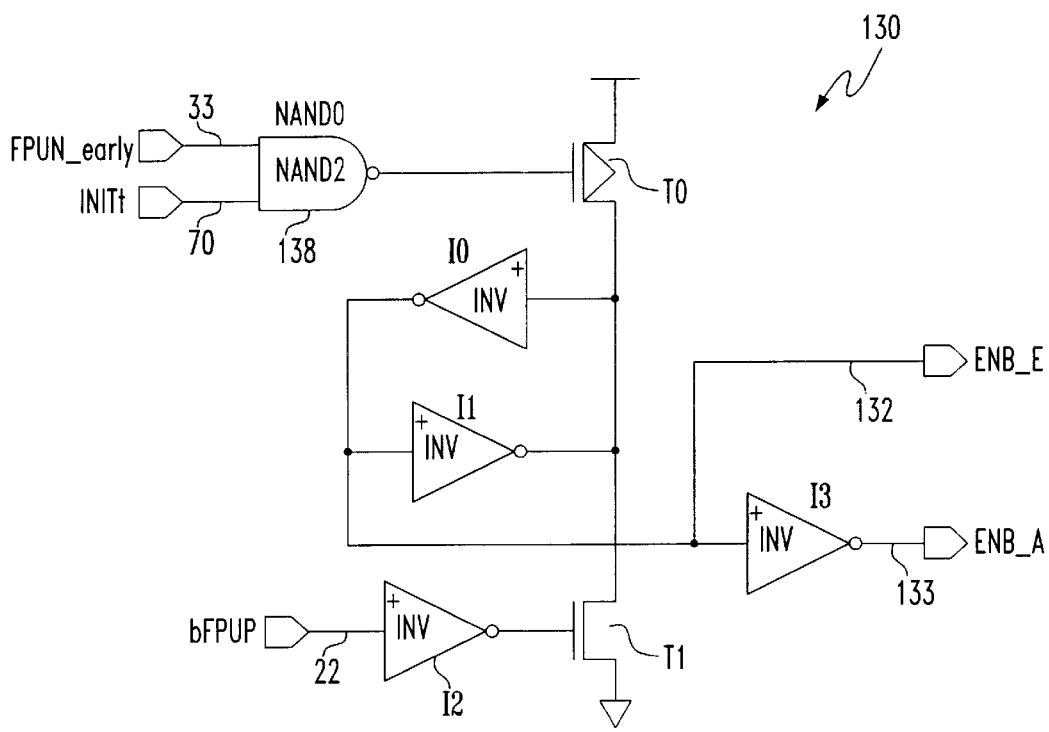
FIG. 7 depicts a control latch circuit 130 implemented for the master universal fuse latch 125 to ensure application of only one of the two signals ENB_A, ENB_E at one time.
Figure 8:
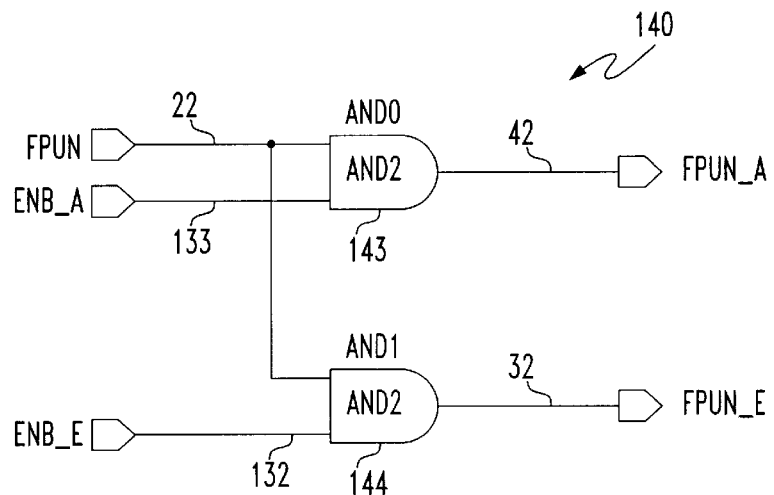
FIG. 8 depicts a further control circuit 140 implemented for locally qualifying the FPUN signal 32 to ensure interrogation of the proper fuse legs in the information fuse bank 150 of FIG. 6.

A flexible, simple and automatic selection of the type of fuse to use in the Universal Fuse Latch having two fuse legs is now described with respect to FIGS. 6–8 with the understanding that the principles may be extended for operation of a universal latch incorporating N fuse legs.

FIG. 6 is a circuit depiction of an example implementation of an individually controlled "fuse bank" 100 implementing universal fuse latches according to the invention. As shown in FIG. 6, there is provided a master fuse latch circuit 125 including the universal fuse latch 25, and a plurality of information fuse latches 150 that are associated with the master fuse latch 125 and each including a universal fuse latch 25. The master universal fuse latch 125 functions to determine which FPUN signal (FPUN_E, FPUN_A) the information fuse latches 150 will use. Thus, for example, if the anti-fuse leg of the master fuse latch is blown, then the FPUN_A signal to the anti-fuse information latches will be enabled, i.e., all the associated information fuse latches 150 will "interrogate" their anti-fuses using the FPUN_A signal, and vice-versa, if the e-poly fuse leg of the master fuse latch is blown, then all the associated information fuse latches 150 will "interrogate" their laser fuses using the FPUN_E signal. The advantages to this implementation are that only one fuse latch is necessary for both the laser fuse and anti-fuse; there is an attendant decrease in the chip size by having a combined fuse latch, and there is an increase the fuse latch flexibility as it may be used as laser/e-fuse or anti-fuse, where the anti-fuse is a post-module repair.

Figure 5B:
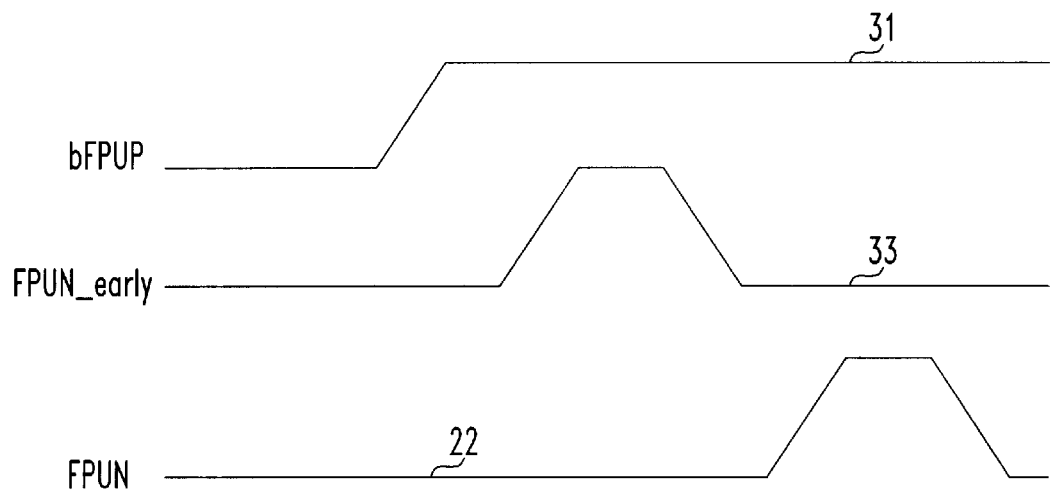
FIG. 5(b) depicts a timing diagram of the signals used for powering up and sensing the universal fuse latch circuit 25 implemented in the master fuse latch control circuit of FIG. 6.

As both FPUN signals cannot be active at the same time for proper operation of master latch, then in order to determine which FPUN signal is to be utilized to decode the information latches, an FPUN_early signal 33 is first generated for receipt by the master control latch as depicted in the timing diagram of FIG. 5(b). This FPUN_early signal 33 particularly enables interrogation of the anti-fuse leg of the universal fuse latch in the master fuse latch 125 of FIG. 6 prior to application of the FPUN signal 22 and after the latch is initialized. That is, the FPUN_early signal 33 is used to strobe/sense the Master Fuse Latch only and is connected to the anti-fuse leg input FPUN_A. The function of the FPUN_early signal is to sense the anti-fuse of the master fuse latch so that, if the master fuse latch anti-fuse is blown, then the associated information fuses 150 will be using anti-fuses as well. Conversely, if the master fuse latch anti-fuse is not blown, then the associated information fuse latches will be using the other use leg (laser fuse/e-fuse). This setup has the anti-fuse leg as the "priority leg" in that it is looked at first and will determine the fate of the information latches (anti-fuse or e-fuse). Even if the laser/e-fuse leg is blown AND the anti-fuse leg is blown, the anti-fuse will be selected. It should be understood also that the "priority fuse leg" may be switched with a few wiring changes. As well, it should be understood that if there are more than two legs in the Universal Fuse Latch, there may be a hierarchy of fuse leg priorities.

As shown in FIG. 6, two other signals are also needed for the universal redundant fuse latch provided in the master and information fuse latch circuits: an enable laser/e-fuse signal ENB_E 132, and an enable anti-fuse signal ENB_A 133. These two signals ENB_A, ENB_E are required in order to steer the universal latch output since the two different FPUN paths indicate a blown fuse state as opposite polarities.

To accomplish this steering, the master universal fuse latch 125 includes a control latch circuit 130 such as depicted in FIG. 7 to ensure that only one of the two signals ENB_A, ENB_E becomes active at one time. Particularly, control latch circuit 130 is a state latch that receives the FPUN_early signal 33, bFPUP precharge signal 31, and the sensed voltage at the node INITt 70 and implements logic for generating two outputs signals ENB_E 132, ENB_A 133 for controlling where the FPUN signal 22 is to be applied for interrogating the fuses. That is, as shown in FIG. 7, while FPUN_early strobe 33 is active, the internal signal INITt 70 of the universal fuse latch will indicate whether the anti-fuse is blown or not blown. If anti-fuse is not blown, the INITt signal 70 will remain at a logical "0" (e.g., the initial precharged state), and if the anti-fuse is blown, then INITt will have transitioned to a logical "1". This all happens while the FPUN_early strobe pulse 33 is active. The state of this latch 130 is used to determine whether the Information Universal Fuse Latches will be sensing the anti-fuse leg or the e-fuse leg as follows: the bFPUP reset pulse 31 that is input to the fuse latches is input to control circuit 130 and resets the initial condition so that the ENB_E signal output 132 is a logic "1" and ENB_A a logic "0". Signals ENB_E and ENB_A are the active high enable signal for the e-fuse leg and the anti-fuse leg, respectively. So while FPUN_early is active, the circuit "monitors" the state of INITt. If INITt stays low during the whole duration of FPUN_early, the ENB_E signal is logic "1" and it means the e-fuse leg is selected for the Information Fuse Latches. If "INITt" goes to logic "1" while FPUN_early is active, then NAND gate element 138 will create a pulse that will flip the state of the latch to ENB_A to become a logic "1" signifying that the anti-fuse leg is selected for the Information Fuse Latches.

After implementing the FPUN_early signal 33 for indicating which type of fuse leg is active by the ENB_E and ENB_A output signals, the next signal processed is FPUN 22 as shown in FIG. 5(b)). FPUN is the strobe that will sense the Information Fuse Latches 150 (FIG. 6). Since there are two legs in the Universal Fuse Latch, a further control circuit 140 depicted in FIG. 8, is implemented for locally qualifying the FPUN signal 32 to decide which leg to use. This circuit essentially receives the FPUN strobe 22 and each of the ENB_A, ENB_E signals creates respective signals, FPUN_A 42 and FPUN_E 32 which are tied to the anti-fuse leg and the e-fuse leg, respectively, of the information universal fuse latches. The FPUN_E and FPUN_A signals are controlled by the ENB_A 133 and ENB_E 132 signals which are already set. If ENB_A is "1", then FPUN_A signal 42 becomes active during the FPUN pulse, by virtue of AND gate 143 and vice versa, if ENB_E is "1", then FPUN_E signal 32 becomes active during the FPUN pulse, by virtue of AND gate 144.

Returning FIG. 6, there is particularly depicted how each of the signals involved for completing the sensing operations for the master control and information latches are connected. Note that the NAND gate 128 in FIG. 6 is provided for receiving the FPUN and ENB_E signals 132 at the input to the Master Fuse Latch 125 in order to obviate the need for re-sensing the latch when subsequent FPUN signals 22 are received if the Master fuse latch anti-fuse is blown. However, if the master anti-fuse is not blown, then the latch will still be sensed to determine if the Master e-fuse leg is blown or intact which as indicated by the control of the ENB_E signal.

While the invention has been particularly shown and described with respect to illustrative and preformed embodiments thereof, it will be understood by those skilled in the art that the foregoing and other changes in form and details may be made therein without departing from the spirit and scope of the invention which should be limited only by the scope of the appended claims.

Having thus described our invention, what we claim as new, and desire to secure by Letters Patent is:

1. A universal fuse latch device comprising:
   a latch circuit receiving an electrical signal for initializing said latch circuit to a first state;
   one or more legs coupled to said latch circuit, with at least a first leg comprising a fuse type element and a compensating element for transitioning said latch circuit from said first state to a second state; and
   a second leg comprising an anti-fuse type element, wherein said compensating element enables the minimum resistance in at least one of said one or more legs to be essentially equal to the minimum resistance of said second leg.

2. The universal fuse latch device according to claim 1, wherein said compensating element is a diode or a transistor device biased to equalize the maximum currents in said at least one first leg and said second leg.

3. The universal fuse latch device according to claim 1, wherein said at least first and second legs include a gate device responsive to a strobe signal for interrogating the state of a selected fuse type element or anti-fuse type element, and wherein said at least first leg includes a laser fuse element having a resistance on the order of about $10^1$ ohms prior to programming and a resistance on the order of $10^6$ ohms after programming.

4. The universal fuse latch device according to claim 1, wherein said at least first leg includes a conducting link of polysilicon having a resistance on the order of about $10^2$ ohms prior to programming and a resistance on the order of $10^3$ ohms or greater after programming.

5. The universal fuse latch device according to claim 1, wherein said at least first leg includes a series connection comprising a laser fine element having a resistance on the order of about $10^1$ ohms prior to programming and a resistance on the order of $10^6$ ohms after programming and, a conducting link of polysilicon having a resistance on the order of about $10^2$ ohms prior to programming and a resistance on the order of $10^3$ ohms or greater after programming.

6. The universal fuse latch device according to claim 1, wherein said anti-fuse type element is formed of two conducting materials separated by an insulating material and forms a conducting filament exhibiting a resistance on the order of $10^3$ ohms or less after programming.

7. The universal fuse latch device according to claim 5, wherein said first leg includes an element providing a resistance in series with said laser fuse element and said polysilicon link, said predefined resistance functioning to alter the effective latch trip point of said first leg.

8. The universal fuse latch device according to claim 7, wherein said resistance element provided in said first leg includes a diodic element.

9. The universal fuse latch device according to claim 7, wherein said resistance element provided in said first leg includes an FET device biased in its linear region.

10. The universal fuse latch device according to claim 1, wherein said latch circuit includes an inverter device having an input for receiving signals at a latch node and an output for providing a latched signal at an output latch node, and, a capacitor device for connection at each said latch and output latch nodes for preventing improper tripping of said latch due to receipt of stray charges that may cause the latch to switch.

11. A programmable fuse bank comprising a plurality of information fuse latches in a system for providing redundancy in memory circuits, each of said plurality of information fuse latches comprising a universal fuse latch device programmed at either first legs comprising a fuse element type or at second legs comprising an anti-fuse element type for providing said redundancy, said redundant memory system comprising:

a master fuse control device for preventing simultaneous interrogation of each first leg and second leg of each said plurality of programmed information fuse latches.

12. The programmable fuse bank according to claim 11, wherein said master fuse control device comprises universal latch circuit programmed in accordance with programmed information fuse latches implemented in said programmable fuse bank, said master fuse control circuit comprising:

mechanism for generating an early strobe signal for said master fuse control device prior to generating an interrogation signal for said plurality of information fuse latches;

logic circuit for receiving said early strobe signal for interrogating one of said first leg including said fuse element and said second leg including said anti-fuse element of said programmed universal latch circuit, and generating a selection signal in accordance with a status of said interrogation, wherein said selection signal is generated for input to each of said information fuse latches to ensure proper interrogation of either said first legs comprising said fuse element type or said second legs comprising said anti-fuse element type of each universal fuse latch provided for determining said redundancy.

13. The programmable fuse bank according to claim 12, wherein said early strobe signal enables interrogation of said second leg including said anti-fuse element of said programmed universal latch circuit first.

14. A programmable fuse bank comprising a plurality of information fuse latches for storing redundancy information in a memory system and capable of being simultaneously interrogated, each said information fuse latch of said programmable fuse bank comprising a universal fuse latch device including:

a latch circuit receiving an electrical signal for initializing said latch circuit to a first state;

one or more legs coupled to said latch circuit, with at least a first leg comprising a fuse type element and a compensating element for transitioning said latch circuit from said first state to a second state; and a second leg comprising an anti-fuse type element, wherein said compensating element enables the minimum resistance in at least one of said one or more legs to be essentially equal to the minimum resistance of said second leg.

15. The programmable fuse bank comprising a plurality of information fuse latches as claimed in claim 14, further comprising a device for programming each of said universal fuse latch devices comprising said information fuse latches of said programmable fuse bank for providing said memory system redundancy, each of said universal fuse latch devices being programmed at either said first legs comprising said fuse type element or at said second legs comprising said anti-fuse type element.

16. The programmable fuse bank comprising a plurality of information fuse latches as claimed in claim 15, wherein said memory system generates a strobe signal for enabling interrogation of each said first and second legs of said information fuse latches, said further programmable fuse bank further comprising a master fuse control device for preventing simultaneous interrogation of each first leg and second leg of each said plurality of programmed information fuse latches.

17. The programmable fuse bank comprising a plurality of information fuse latches as claimed in claim 16, wherein said master fuse control device comprises universal latch circuit programmed in accordance with a priority of legs to be interrogated in said information fuse latches implemented in said programmable fuse bank, said memory system comprising a mechanism for generating an early strobe signal prior to generating said interrogation strobe signal for said plurality of information fuse latches, said master fuse control device interrogating one of said first leg including said fuse type element and said second leg including said anti-fuse type element of said programmed universal latch circuit in response to receipt of said early strobe signal for determining said priority according to a latch state.

18. The programmable fuse bank comprising a plurality of information fuse latches as claimed in claim 17, wherein said master fuse control device comprises logic circuit for generating a selection signal in accordance with said priority, said selection signal for indicating which leg of said information fuse latches to interrogate.

19. The programmable fuse bank comprising a plurality of information fuse latches as claimed in claim 18, comprising a further control circuit responsive to receipt of said selection signal and said strobe signal for enabling proper interrogation of either said first legs comprising said fuse element type or said second legs comprising said anti-fuse element type of each universal fuse latch provided for determining said redundancy.

20. A method for providing redundancy in memory circuits comprising:
   a) providing a programmable fuse bank comprising a plurality of information fuse latches for storing redundancy information in a memory system and capable of being simultaneously interrogated, each said information fuse latch of said programmable fuse bank comprising a universal fuse latch structure including a latch circuit receiving an electrical signal for initializing said latch circuit to a first state; one or more legs coupled to said latch circuit, with at least a first leg comprising a fuse type element and a compensating element for transitioning said latch circuit from said first state to a second state, wherein said fuse latch is provided with a fuse resistance trip point to ensure adequate reading of either one of said fuse and anti-fuse element type in accordance with said redundancy information; and a second leg comprising an anti-fuse type element, wherein said compensating element enables the minimum resistance in at least one of said one or more legs to be essentially equal to the minimum resistance of said second leg;
   b) determining a priority of legs to be interrogated in said programmable fuse bank prior to interrogation; and
   c) generating an interrogation strobe signal for input to said plurality of information fuse latches for enabling simultaneous interrogation of said priority legs as determined in step b) in order to determine said redundancy information.

21. The method as claimed in claim 20, wherein said determining step b) comprises the step of:
   providing a master fuse control device comprising universal latch circuit programmed in accordance with a priority of legs to be interrogated in said information fuse latches implemented in said programmable fuse bank; and,
   generating an early strobe signal prior to generating said interrogation strobe signal for said plurality of information fuse latches, said master fuse control device interrogating one of said first leg including said fuse type element and said second leg including said anti-fuse type element of said programmed universal latch circuit in response to receipt of said early strobe signal for determining said priority according to a latch state.

22. The method as claimed in claim 21, wherein said generating step c) further comprises the step of:
   generating a selection signal in accordance with said priority, said selection signal for indicating which leg of said information fuse latches to interrogate; and
   enabling proper interrogation of either said first legs comprising said fuse element type or said second legs comprising said anti-fuse element type of each universal fuse latch provided for determining said redundancy information.

23. A method for programming a universal fuse latch device comprising one or more legs connected at a latch node, said device including a first leg implementing a series connection of a laser fuse element and an electrical fuse element each capable of transitioning said latch from said first state to a second state, and a second leg including an anti-fuse type element, wherein said method comprises steps of: blowing said laser fuse element for latching a state of the laser fuse at a wafer level of processing, and, subsequent thereto, latching a state of one of said electrical fuse element or anti-fuse type element at a module level of processing, wherein said universal fuse latch device is provided with a fuse resistance trip point to ensure adequate reading of one of said electrical fuse and anti-fuse type element at said module level.

* * * * *